(12) United States Patent
Schierling et al.

(10) Patent No.: US 11,913,999 B2
(45) Date of Patent: Feb. 27, 2024

(54) DETECTION OF A GROUND FAULT IN A DIRECT-CURRENT NETWORK

(71) Applicant: Siemens Aktiengesellschaft, Munich (DE)

(72) Inventors: Hubert Schierling, Erlangen (DE); Benno Weis, Hemhofen (DE)

(73) Assignee: SIEMENS AKTIENGESELLSCHAFT, Munich (DE)

( * ) Notice: Subject to any disclaimer, the term of this patent is extended or adjusted under 35 U.S.C. 154(b) by 273 days.

(21) Appl. No.: 17/601,809

(22) PCT Filed: Mar. 18, 2020

(86) PCT No.: PCT/EP2020/057443
§ 371 (c)(1),
(2) Date: Oct. 6, 2021

(87) PCT Pub. No.: WO2020/207729
PCT Pub. Date: Oct. 15, 2020

(65) Prior Publication Data
US 2022/0146595 A1 May 12, 2022

(30) Foreign Application Priority Data
Apr. 8, 2019 (EP) .................... 19167797

(51) Int. Cl.
*G01R 31/52* (2020.01)
*H02H 3/04* (2006.01)
(Continued)

(52) U.S. Cl.
CPC .......... *G01R 31/52* (2020.01); *H02H 1/0007* (2013.01); *H02H 3/042* (2013.01); *H02H 3/16* (2013.01); *H02H 7/268* (2013.01); *H02H 11/00* (2013.01)

(58) Field of Classification Search
CPC ...... H02H 1/0007; H02H 1/003; H02H 3/033; H02H 3/04; H02H 3/042; H02H 3/10;
(Continued)

(56) References Cited

U.S. PATENT DOCUMENTS

2006/0119997 A1* 6/2006 Lee .................. H02H 3/335
361/42
2012/0025840 A1* 2/2012 Kim .................. G01R 31/52
324/509
(Continued)

FOREIGN PATENT DOCUMENTS

| EP | 2860838 A1 | 4/2015 |
|---|---|---|
| WO | WO 2010036153 A1 | 4/2010 |
| WO | WO 2019001714 A1 | 1/2019 |

OTHER PUBLICATIONS

PCT International Search Report and Written Opinion of International Searching Authority dated Jun. 23, 2020 corresponding to PCT International Application No. PCT/EP2020/057443 filed Mar. 18, 2020.
(Continued)

*Primary Examiner* — Thienvu V Tran
*Assistant Examiner* — Shahzeb K Ahmad
(74) *Attorney, Agent, or Firm* — Harness, Dickey & Pierce, P.L.C

(57) ABSTRACT

A method is for detecting a ground fault in a load zone that can be connected to a direct-current network. The load zone includes a first load zone line connectable to a first main line of the direct-current network via a circuit breaker, and a second load zone line connectable to a second main line of the direct-current network via an interrupter switch. In an embodiment of the method, at least one line voltage at a load zone line is continually measured. If a ground fault is not detected at any main line of the direct-current network before the load zone is connected, the interrupter switch is
(Continued)

closed while the circuit breaker is open, and a ground fault in the load zone is inferred if at least one line voltage does not significantly change after the interrupter switch is closed.

20 Claims, 2 Drawing Sheets

(51) Int. Cl.
    *H02H 7/26*     (2006.01)
    *H02H 11/00*     (2006.01)
    *H02H 1/00*     (2006.01)
    *H02H 3/16*     (2006.01)

(58) Field of Classification Search
    CPC ............ H02H 3/105; H02H 3/16; H02H 3/20; H02H 3/202; H02H 7/26; H02H 7/268; H02H 11/00; G01R 19/165; G01R 19/16509; G01R 19/16538; G01R 19/16547; G01R 31/52

See application file for complete search history.

(56) References Cited

U.S. PATENT DOCUMENTS

| | | | |
|---|---|---|---|
| 2014/0103936 A1* | 4/2014 | Lasson ................. | G01R 31/006 324/503 |
| 2015/0097571 A1* | 4/2015 | Wei ........................ | G01R 31/52 324/531 |
| 2015/0372474 A1* | 12/2015 | Davidson ............... | H02H 3/087 361/101 |
| 2020/0136428 A1* | 4/2020 | Zhang ..................... | H02H 3/16 |

OTHER PUBLICATIONS

European Search Report for European Application No. 19167797 dated Oct. 16, 2019.

\* cited by examiner

US 11,913,999 B2

DETECTION OF A GROUND FAULT IN A DIRECT-CURRENT NETWORK

PRIORITY STATEMENT

This application is the national phase under 35 U.S.C. § 371 of PCT International Application No. PCT/CN2020/057443 which has an International filing date of Mar. 18, 2020, which designated the United States of America and which claims priority to European application number EP 19167797.0 filed Apr. 8, 2019, the entire contents of each of which are hereby incorporated herein by reference.

FIELD

Embodiments of the present invention generally relate to a method for detecting a ground fault in a load zone that is connectable to a DC system, and a connecting unit for connecting a load zone to a DC system.

BACKGROUND

A DC system which is insulated in relation to a ground potential or is grounded by way of a high impedance, can continue to be operated in the event of a ground fault of a DC voltage potential. The ground fault itself can easily be detected during operation by the measurement and evaluation of the voltages between the DC voltage potentials of the DC system and a ground potential. However, it is difficult to identify a load zone which is supplied by the DC system and in which the ground fault occurs. The identification of that load zone in which a ground fault occurs is important, however, in order to eliminate the ground fault. In order to identify the faulty load zone, a so-called common-mode current, that is to say a fault current that is the sum of the currents in the two lines connecting the load zone to the main lines of the DC system, could be measured for example at a point where each load zone is connected to the DC system, for example at the input of a switchgear cabinet. If one of the common-mode currents is different than zero, this indicates that the ground fault has occurred in the associated load zone. The measurements of the common-mode currents could be carried out for example permanently or manually by maintenance personnel. However, such measurements involve a high outlay in any case.

SUMMARY

Embodiments of the invention specify an improved method for detecting a ground fault in a load zone that is connectable to a DC system.

Embodiments are directed to a method and a connecting unit.

The claims relates to advantageous configurations of the invention.

The method according to an embodiment of the invention serves for detecting a ground fault in a load zone that is connectable to a DC system, the load zone having a first load zone line, which is grounded via a parallel circuit formed by a first grounding capacitor and a first grounding resistor and is connectable to a first main line of the DC system via a circuit breaker, and having a second load zone line, which is grounded via a parallel circuit formed by a second grounding capacitor and a second grounding resistor and is connectable to a second main line of the DC system via an interrupter switch. In the method, at least one line voltage, assigned to a load zone line between a line potential of the load zone line and a ground potential is measured continuously. In the case where a ground fault is not detected on any main line of the DC system before the load zone is connected, the interrupter switch is closed with the circuit breaker being open, and a ground fault in the load zone is deduced if at least one line voltage does not change significantly after the interrupter switch is closed. Here and hereinafter it is always assumed that the DC system is insulated in relation to a ground potential or is grounded by way of a high impedance.

A connecting unit according to an embodiment of the invention for connecting a load zone to a DC system having two main lines and a ground fault monitoring unit, which is configured to detect a ground fault on the main line for each main line, the connecting unit comprises:
  a circuit breaker connected between the first main line and a first load zone line of the load zone,
  an interrupter switch connected between the second main line and a second load zone line of the load zone,
  for at least one load zone line a measuring unit configured to measure continuously a line voltage, assigned to the load zone line, between a line potential of the load zone line and a ground potential, and
  a control unit configured to control the circuit breaker and to identify the switching state of the interrupter switch, to receive the measurement signals of the at least one measuring unit and the ground fault monitoring unit and, in the case where a ground fault is not detected on any main line of the DC system before the load zone is connected, to deduce a ground fault in the load zone if at least one line voltage does not change significantly after the interrupter switch is closed with the circuit breaker being open.

BRIEF DESCRIPTION OF THE DRAWINGS

The above-described properties, features and advantages of this invention and the way in which they are achieved will become clearer and more clearly understood in association with the following description of example embodiments which are explained in greater detail in association with the drawings, in which.

Mutually corresponding parts are provided with the same reference signs in the figures.

DETAILED DESCRIPTION OF THE EXAMPLE EMBODIMENTS

Figure 1:
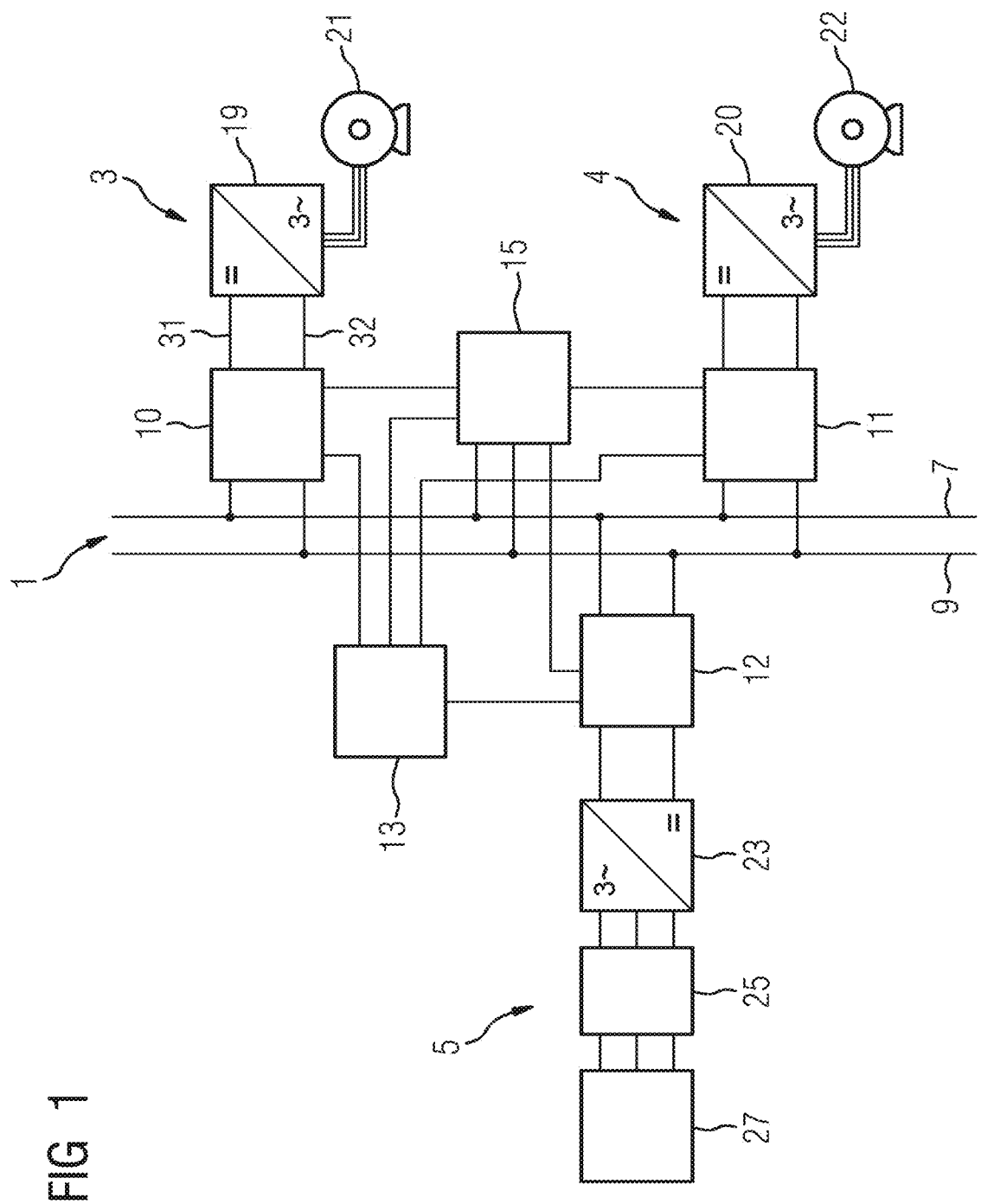
FIG. 1 shows a block diagram of a DC system to which a plurality of load zones are connectable.

The method according to an embodiment of the invention serves for detecting a ground fault in a load zone that is connectable to a DC system, the load zone having a first load zone line, which is grounded via a parallel circuit formed by a first grounding capacitor and a first grounding resistor and is connectable to a first main line of the DC system via a circuit breaker, and having a second load zone line, which is grounded via a parallel circuit formed by a second grounding capacitor and a second grounding resistor and is connectable to a second main line of the DC system via an interrupter switch. In the method, at least one line voltage, assigned to a load zone line between a line potential of the load zone line and a ground potential is measured continuously. In the case where a ground fault is not detected on any main line of the DC system before the load zone is connected, the interrupter switch is closed with the circuit breaker being open, and a ground fault in the load zone is deduced if at least one line voltage does not change significantly after the interrupter switch is closed. Here and hereinafter it is always assumed that the DC system is insulated in relation to a ground potential or is grounded by way of a high impedance.

The method exploits the fact that, before the interrupter switch is closed, both grounding capacitors are discharged and thus both line voltages are zero and, therefore, after the interrupter switch is closed, they remain at zero or at a small value if a ground fault is present on one of the load zone lines. Therefore, a ground fault in the load zone can be detected by virtue of the fact that at least one line voltage does not change or changes only slightly after the interrupter switch is closed. The method thus makes it possible, in particular advantageously, to detect a ground fault in a load zone even before the load zone is connected to the DC system via the circuit breaker.

One configuration of the method provides that continuously for both load zone lines in each case the assigned line voltage is measured and evaluated. This advantageously enables a more reliable detection of a ground fault in the load zone than the measurement and evaluation of only one line voltage.

Furthermore, it can be provided that a first delay duration and an absolute or relative first minimum change are predefined and a change in a line voltage after the interrupter switch is closed is classified as significant if the change exceeds the first minimum change after the first delay duration has elapsed after the interrupter switch is closed.

The predefinition of the first minimum change for a line voltage makes it possible to quantify when a change in a line voltage after the interrupter switch is closed is regarded as significant. As a result, incorrect decisions on account of changes in the line voltage that arise despite a ground fault can advantageously be reduced or completely avoided. The predefinition of the first delay duration for the evaluation of the change in a line voltage advantageously makes it possible to advantageously reduce or completely avoid incorrect detections of ground faults on account of transient recovery processes after the interrupter switch is closed. The first delay duration is predefined for example in the range of 0.1 ms to 100 ms. In particular, approximately 1 ms can be predefined as the first delay duration. The first minimum change is predefined for example in the range of 5% to 50% of a rated voltage of the DC system. In particular, it can be approximately 16% of the rated voltage.

A further configuration of the method provides that the first load zone line, besides being connectable to the first main line via the circuit breaker, is connectable to the first main line via a series circuit formed by a precharge switch and a precharge resistor, the series circuit being connected in parallel with the circuit breaker, and that in the case where a ground fault is detected on the second main line of the DC system before the load zone is connected, the precharge switch is closed with the circuit breaker being open and with the interrupter switch being open, and a ground fault in the load zone is deduced if at least one line voltage does not change significantly after the precharge switch is closed. If the two load zone lines are connected to one another by way of a storage capacitor and a state of charge of the storage capacitor is detected, a ground fault on the first load zone line can furthermore be deduced if the storage capacitor does not become charged significantly after the precharge switch is closed, and/or a ground fault on the second load zone line can be deduced if the storage capacitor becomes charged significantly after the precharge switch is closed.

The abovementioned configurations of the method exploit the fact that in the case of a ground fault on the second main line after the precharge switch is closed, the line voltage assigned to a load zone line remains at zero or at a small value if a ground fault is present on the load zone line. In this case, the precharge resistor prevents the immediate production of a short circuit in the DC system as a result of the precharge switch being closed. By contrast, if a ground fault is present on the first main line before the load zone is connected, the ground fault detection in the load zone is not possible in a corresponding manner because the closing of the precharge switch does not bring about a change in potential in the load zone and the closing of the interrupter switch immediately produces a short circuit in the DC system.

Furthermore, it can be provided that a second delay duration and an absolute or relative second minimum change are predefined and a change in a line voltage after the precharge switch is closed is classified as significant if the change exceeds the second minimum change after the second delay duration has elapsed after the precharge switch is closed. In this case, the second delay duration can correspond to the first delay duration and the second minimum change can correspond to the first minimum change. Charging of the storage capacitor is classified as significant for example if the storage capacitor becomes charged by a predefined minimum charging within a predefined measurement duration. By way of example, a measurement duration in the range of 100 ms to 5 s, in particular a measurement duration of approximately 1 s, and a minimum charging in the range of 10% to 50% of the rated voltage of the DC system, in particular a minimum charging of approximately 20% of the rated voltage, are predefined.

A connecting unit according to an embodiment of the invention for connecting a load zone to a DC system having two main lines and a ground fault monitoring unit, which is configured to detect a ground fault on the main line for each main line, the connecting unit comprises:
  a circuit breaker connected between the first main line and a first load zone line of the load zone,
  an interrupter switch connected between the second main line and a second load zone line of the load zone,
  for at least one load zone line a measuring unit configured to measure continuously a line voltage, assigned to the load zone line, between a line potential of the load zone line and a ground potential, and
  a control unit configured to control the circuit breaker and to identify the switching state of the interrupter switch, to receive the measurement signals of the at least one measuring unit and the ground fault monitoring unit and, in the case where a ground fault is not detected on any main line of the DC system before the load zone is connected, to deduce a ground fault in the load zone if at least one line voltage does not change significantly after the interrupter switch is closed with the circuit breaker being open.

Furthermore, the connecting unit can comprise a series circuit formed by a precharge switch and a precharge resistor, the series circuit being connected in parallel with the circuit breaker, and the control unit can be configured to identify the switching state of the precharge switch and, in the case where a ground fault is detected on the second main line of the DC system before the load zone is connected, to deduce a ground fault in the load zone if a line voltage does not change significantly after the precharge switch is closed with the circuit breaker being open and the interrupter switch being open.

A connecting unit according to an embodiment of the invention makes it possible to carry out the method according to an embodiment of the invention with the advantages already mentioned above.

FIG. 1 schematically shows a DC system 1 to which a plurality of load zones 3, 4, 5 are connectable. The DC system 1 is insulated in relation to a ground potential or is grounded by way of a high impedance.

The DC system 1 has two electrical main lines 7, 9, for each load zone 3, 4, 5 a connecting unit 10, 11, 12 and also a system control unit 13 and a ground fault monitoring unit 15.

Three load zones 3, 4, 5 are illustrated by way of example in the figure. A first load zone 3 and a second load zone 4 each have a power converter 19, 20 and an electrical machine 21, 22. A third load zone 5 has a power converter 23, a switching and protection unit 25 for AC current and an AC system 27, wherein the switching and protection unit 25 is connected between the AC system 27 and the power converter 23. Each power converter 19, 20, 23 is connected to a connecting unit 10, 11, 12.

A first main line 7 is at a first DC voltage potential of the DC system 1. The second main line 9 is at a second DC voltage potential of the DC system 1.

Each connecting unit 10, 11, 12 is assigned to a load zone 3, 4, 5 that is connectable to the DC system 1 by the connecting unit 10, 11, 12.

The system control unit 13 is connected to the connecting units 10, 11, 12 and the ground fault monitoring unit 15. The connecting of the load zones 3, 4, 5 is controlled by the system control unit 13.

The ground fault monitoring unit 15 is configured to detect ground faults on the main lines 7, 9. To that end, the ground fault monitoring unit 15 is connected to each main line 7, 9 and is configured to measure the voltages between the ground potential and the DC voltage potentials of the main lines 7, 9. Furthermore, the ground fault monitoring unit 15 is configured to report a detected ground fault to the connecting units 10, 11, 12 and the system control unit 13.

Figure 2:
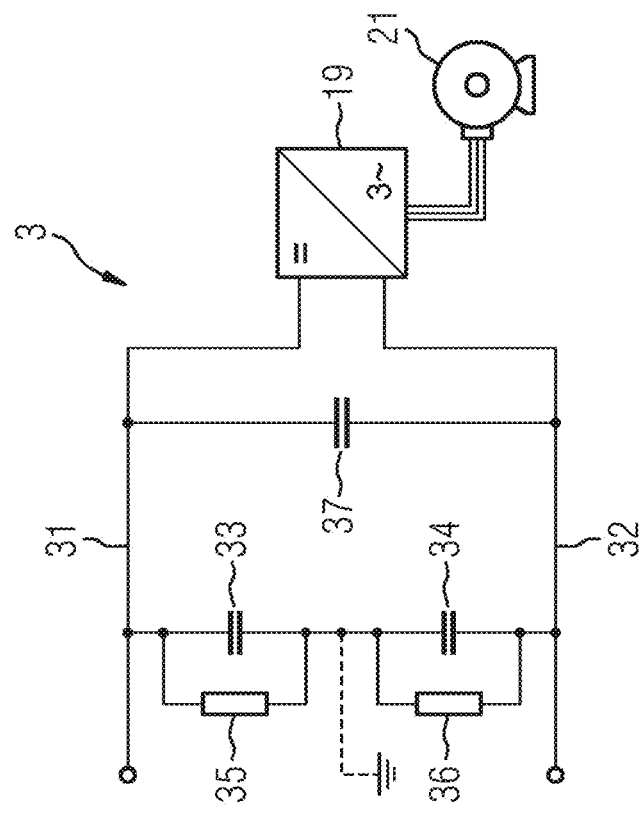
FIG. 2 shows a block diagram of a load zone.

FIG. 2 shows by way of example a block diagram of the load zone 3. The load zone 3 has a first load zone line 31, which is grounded resistively-capacitively at high impedance via a parallel circuit formed by a first grounding capacitor 33 and a first grounding resistor 35. Furthermore, the load zone 3 has a second load zone line 32, which is grounded resistively-capacitively at high impedance via a parallel circuit formed by a second grounding capacitor 34 and a second grounding resistor 36. The grounding capacitors 33, 34 have identical capacitances in order that the line potentials of the load zone lines 31, 32 are kept balanced with respect to the ground potential during fault-free operation. The load zone lines 31, 32 are furthermore connected to one another by way of a storage capacitor 37.

Figure 3:
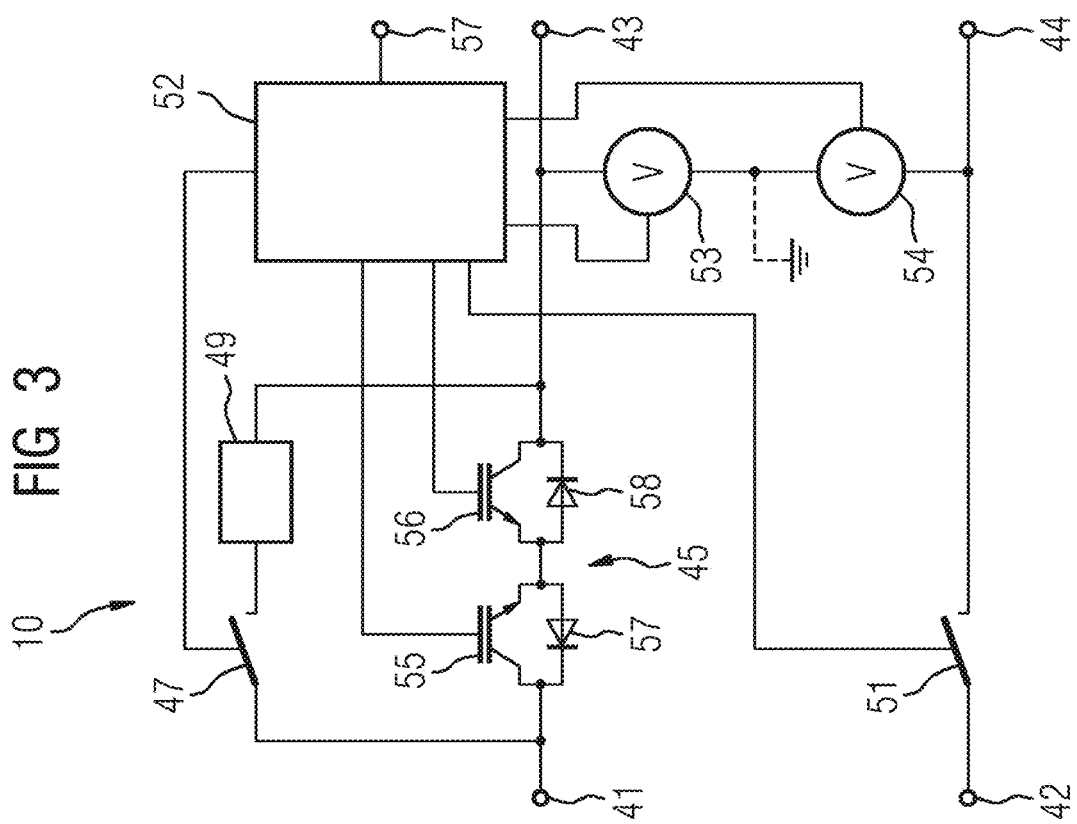
FIG. 3 shows a block diagram of a connecting unit by which a load zone is connectable to the DC system.

FIG. 3 shows a block diagram of the connecting unit 10 assigned to the load zone 3. The connecting unit 10 has two system-side connections 41, 42, two load-zone-side connections 43, 44, a circuit breaker 45, a precharge switch 47, a precharge resistor 49, an interrupter switch 51, a control unit 52 and two measurement units 53, 54.

A first system-side connection 41 is connected to the first main line 7. The second connection 42 is connected to the second main line 9. A first load-zone-side connection 43 is connected to the first load zone line 31. The second load-zone-side connection 44 is connected to the second load zone line 32.

The circuit breaker 45 is connected between the first system-side connection 41 and the first load-zone-side connection 43. The circuit breaker 45 has two semiconductor switches 55, 56 capable of being turned off and two diodes 57, 58. The semiconductor switches 55, 56 are connected in antiseries, that is to say that the semiconductor switches 55, 56 are connected in series but with mutually opposite forward directions. Each diode 57, 58 is connected in antiparallel with one of the semiconductor switches 55, 56. The circuit breaker 44 is embodied as a fast switch that can turn off short-circuit currents.

The precharge switch 47 and the precharge resistor 49 are connected in series, wherein the series circuit formed by the precharge switch 47 and the precharge resistor 49 is connected in parallel with the circuit breaker 45 between the first system-side connection 41 and the first load-zone-side connection 43. The precharge switch 47 is a mechanical switch, for example.

The interrupter switch 51 is connected between the second system-side connection 42 and the second load-zone-side connection 44. The interrupter switch 51 is a mechanical load disconnecting switch, for example.

A first measuring unit 53 is configured to measure continuously a first line voltage, assigned to the first load zone line 31, between a line potential of the first load zone line 31 and the ground potential. The second measuring unit 54 is configured to measure continuously a second line voltage, assigned to the second load zone line 32, between a line potential of the second load zone line 32 and the ground potential. The measuring units 53, 54, transmit the measurement signals detected by them to the control unit 52.

The control unit 52 is configured to control the circuit breaker 45 or the semiconductors switches 55, 56 thereof and to identify the switching states of the precharge switch 47 and of the interrupter switch 51. Furthermore, the control unit 52 has an interface 57, via which it is connected to the system control unit 13 and the ground fault monitoring unit 15 and via which control signals of the system control unit 13 are communicated to it and ground faults detected by the ground fault monitoring unit 15 are reported.

If the load zone 3 is disconnected from the DC system 1, the circuit breaker 45 (or both semiconductors switches 55, 56), the precharge switch 47 and the interrupter switch 51 are open. If no ground fault is present, firstly the interrupter switch 51, then the precharge switch 47 and finally, after the conclusion of the pre-charging of the capacitors 33, 34, 37, the circuit breaker 45 are closed for the purpose of connecting the load zone 3.

According to an embodiment of the invention, in the case where a ground fault is not detected on any main line 7, 9 of the DC system before the load zone 3 is connected, the line voltages are evaluated by the control unit 52 after the interrupter switch 51 is closed, but before the precharge switch 47 and the circuit breaker 45 are closed, a check being made to ascertain whether the line voltages change significantly after the interrupter switch 51 is closed. If at least one line voltage does not change significantly, a ground fault in the load zone 3 is deduced. To that end, for example, for each line voltage a first delay duration and an absolute or relative first minimum change are predefined and a change in the line voltage after the interrupter switch 51 is closed is classified as significant if the change exceeds the first minimum change after the first delay duration has elapsed after the interrupter switch 51 is closed.

In the case where a ground fault is detected on the second main line 9 of the DC system 1 before the load zone 3 is connected, the precharge switch 47, rather than the interrupter switch 51, is closed first and the line voltages are evaluated before the interrupter switch 51 and the circuit breaker 45 are closed. A ground fault in the load zone 3 is deduced if a line voltage does not change significantly after the precharge switch 47 is closed. To that end, for example, for each line voltage a second delay duration and an absolute or relative second minimum change are predefined and a change in the line voltage after the precharge switch 47 is closed is classified as significant if the change exceeds the second minimum change after the second delay duration has elapsed after the precharge switch 47 is closed. In this case, the precharge resistor 49 prevents closing of the precharge switch 47 from immediately producing a short circuit in the DC system 1. Furthermore, a state of charge of the storage capacitor 37 can be detected, and a ground fault on the first load zone line 31 can be deduced if the storage capacitor 37 does not become charged significantly after the precharge switch 47 is closed, and a ground fault on the second load zone line 32 can be deduced if the storage capacitor 37 becomes charged significantly after the precharge switch 47 is closed.

If a ground fault is present on the first main line 7 before the load zone 3 is connected, the ground fault detection in the load zone 3 is not possible in a corresponding manner because the closing of the precharge switch 47 does not bring about a change in potential in the load zone 3 and the closing of the interrupter switch 51 would immediately produce a short circuit in the DC system 1 if a ground fault is already present on the load zone line 32.

A ground fault in the load zone 3 that is detected by the control unit 52 is reported to the system control unit 13 by the control unit 52 via the interface 57.

The example embodiments of the method according to the invention and of a connecting unit 10 according to an embodiment of the invention that have been described with reference to the figures can be modified in various ways to form further example embodiments. By way of example, provision can be made for the line voltages detected by the measuring units 53, 54 to be evaluated by the system control unit 13 rather than locally by the control unit 52 of the connecting unit 10.

Alternatively or additionally, provision can be made for only the first or only the second line voltage to be measured and evaluated.

By way of example, provision can be made for only the first line voltage to be measured and evaluated. In the case where a ground fault is not detected on any main line 7, 9 of the DC system before the load zone 3 is connected, then once again firstly the interrupter switch 51 is closed and the first line voltage is evaluated before the precharge switch 47 and the circuit breaker 45 are closed. If the first line voltage does not change significantly after the interrupter switch 51 is closed, a ground fault in the load zone 3 is deduced. In the case where a ground fault is detected on the second main line 9 of the DC system 1 before the load zone 3 is connected, the precharge switch 47 is closed first and the line voltages are evaluated before the interrupter switch 51 and the circuit breaker 45 are closed. A ground fault in the load zone 3 is deduced if the first line voltage does not change significantly after the precharge switch 47 is closed.

Although the invention has been more specifically illustrated and described in detail via preferred example embodiments, nevertheless the invention is not restricted by the examples disclosed and other variations can be derived therefrom by the person skilled in the art, without departing from the scope of protection of the invention.

The invention claimed is:

1. A method for detecting a ground fault in a load zone connectable to a DC system, the load zone, including a first load zone line grounded via a parallel circuit formed by a first grounding capacitor and a first grounding resistor, connectable to a first main line of the DC system via a circuit breaker and includes a second load zone line grounded via a parallel circuit formed by a second grounding capacitor and a second grounding resistor, connectable to a second main line of the DC system via an interrupter switches, the method comprising:

measuring continuously at least one line voltage, each at least one line voltage being assigned to one of the first load zone line and the second zone load line, between a line potential of the respective one of the first load zone line and the second load zone line, and a ground potential is measured, and closing the interrupter switch, upon a ground fault not being detected on any of the first main line and second main line of the DC system before the load zone is connected, with the circuit breaker being open; and deducing a ground fault in the load zone upon the at least one line voltage not significantly changing after the interrupter switch is closed.

2. The method of claim 1, wherein the continuously measuring includes continuously measuring and evaluating the assigned line voltage for both of the first load zone line and the second zone load line.

3. The method of claim 2, wherein a first delay duration and an absolute or relative first minimum change are defined and a change in a line voltage after the interrupter switch is closed is classified as significant upon the change exceeding the absolute or relative first minimum change after the first delay duration has elapsed after the interrupter switch is closed.

4. The method of claim 3, wherein the first delay duration is defined in a range of 0.1 ms to 100 ms.

5. The method of claim 4, wherein the first minimum change is defined in a range of 5% to 50% of a rated voltage of the DC system.

6. The method of claim 2, wherein the first load zone line, besides being connectable to the first main line via the circuit breaker, is connectable to the first main line via a series circuit formed by a precharge switch and a precharge resistor, the series circuit being connected in parallel with the circuit breaker, and wherein upon where the ground fault being detected on the second main line of the DC system before the respective load zone is connected, the precharge switch is closed with the circuit breaker being open and with the interrupter switch being open, and a ground fault in the load zone is deduced upon at least one line voltage not changing significantly after the precharge switch is closed.

7. The method of claim 6, wherein the first load zone line and the second zone load line are connected to one another via a storage capacitor and a state of charge of the storage capacitor is detected, and wherein a ground fault on the first load zone line is deduced upon the storage capacitor not becoming charged significantly after the precharge switch is closed.

8. The method of claim 7, wherein a ground fault on the second load zone line is deduced upon the storage capacitor becoming charged significantly after the precharge switch is closed.

9. The method of claim 6, wherein a second delay duration and an absolute or relative second minimum change are defined and wherein a change in a line voltage after the precharge switch is closed is classified as significant upon the change exceeding the second minimum change after the second delay duration has elapsed after the precharge switch is closed.

10. The method of claim 1, wherein a first delay duration and an absolute or relative first minimum change are defined and a change in a line voltage after the interrupter switch is closed is classified as significant upon the change exceeding the absolute or relative first minimum change after the first delay duration has elapsed after the interrupter switch is closed.

11. The method of claim 10, wherein the first delay duration is defined in a range of 0.1 ms to 100 ms.

12. The method of claim 11, wherein the first minimum change is defined in a range of 5% to 50% of a rated voltage of the DC system.

13. The method of claim 10, wherein the first minimum change is defined in a range of 5% to 50% of a rated voltage of the DC system.

14. The method of claim 1, wherein the first load zone lined, besides being connectable to the first main line via the circuit breaker, is connectable to the first main line via a series circuit formed by a precharge switch and a precharge resistor, the series circuit being connected in parallel with the circuit breaker, and wherein upon where the ground fault being detected on the second main line of the DC system before the respective load zone is connected, the precharge switch is closed with the circuit breaker being open and with the interrupter switch being open, and a ground fault in the load zone is deduced upon at least one line voltage not changing significantly after the precharge switch is closed.

15. The method of claim 14, wherein the first load zone line and the second zone load line are connected to one another via a storage capacitor and a state of charge of the storage capacitor is detected, and wherein a ground fault on the first load zone line is deduced upon the storage capacitor not becoming charged significantly after the precharge switch is closed.

16. The method of claim 15, wherein a ground fault on the second load zone line is deduced upon the storage capacitor becoming charged significantly after the precharge switch is closed.

17. The method of claims 14, wherein a second delay duration and an absolute or relative second minimum change are defined and wherein a change in a line voltage after the precharge switch is closed is classified as significant upon the change exceeding the second minimum change after the second delay duration has elapsed after the precharge switch is closed.

18. The method of claim 15, wherein a second delay duration and an absolute or relative second minimum change are defined and wherein a change in a line voltage after the precharge switch is closed is classified as significant upon the change exceeding the second minimum change after the second delay duration has elapsed after the precharge switch is closed.

19. A connecting unit for connecting a load zone to a DC system including two main lines and a ground fault monitoring unit configured to detect a ground fault on the main line for each of first main line and a second main line of the two main lines and produce measurement signals, the connecting unit comprising:
a circuit breaker connected between the first main line and a first load zone line of the load zone;
an interrupter switch connected between the second main line and a second load zone line of the load zone,
at least one measuring unit for at least a respective one of the first load zone line and the second load zone line, configured to continuously measure a line voltage, assigned to the respective one of the first load zone line and the second load zone line, between a line potential of the respective one of the first load zone line and the second load zone line and a ground potential, to produce measurement signals; and
a control unit, configured to control the circuit breaker and to identify a switching state of the interrupter switches, to receive the measurement signals of the at least one measuring unit and the ground fault monitoring unit and, upon a ground fault not being detected on any of the first main line and the second main line of the DC system before the load zone is connected, to deduce a ground fault in the load zone upon at least one line voltage not changing significantly after the interrupter switch is closed with the circuit breaker being open.

20. The connecting unit of claim 19, further comprising:
a series circuit formed by a precharge switch and a precharge resistor, the series circuit being connected in parallel with the circuit breaker, wherein the control unit is configured to identify a switching state of the precharge switch and, upon the ground fault being detected on the second main line of the DC system before the load zone is connected, to deduce a ground fault in the load zone upon at least one line voltage not significantly changing after the precharge switch is closed with the circuit breaker being open and the interrupter switch being open.

* * * * *